United States Patent
Wang et al.

(10) Patent No.: US 8,053,885 B2
(45) Date of Patent: Nov. 8, 2011

(54) WAFER LEVEL VERTICAL DIODE PACKAGE STRUCTURE AND METHOD FOR MAKING THE SAME

(75) Inventors: Bily Wang, Hsinchu (TW); Sung-Yi Hsiao, Gongguan Shiang (TW); Jack Chen, Toufen Township, Miaoli County (TW)

(73) Assignee: Harvatek Corporation, Hsinchu (TW)

( * ) Notice: Subject to any disclaimer, the term of this patent is extended or adjusted under 35 U.S.C. 154(b) by 214 days.

(21) Appl. No.: 12/318,876

(22) Filed: Jan. 12, 2009

(65) Prior Publication Data

US 2010/0176502 A1 Jul. 15, 2010

(51) Int. Cl.
*H01L 23/485* (2006.01)
(52) U.S. Cl. .......... 257/690; 257/E23.019; 257/E29.329
(58) Field of Classification Search .................. None
See application file for complete search history.

(56) References Cited

U.S. PATENT DOCUMENTS

| | | | | |
|---|---|---|---|---|
| 3,708,722 A * | 1/1973 | Wiles | | 257/796 |
| 4,176,443 A * | 12/1979 | Iannuzzi et al. | | 438/106 |
| 4,638,553 A * | 1/1987 | Nilarp | | 438/458 |
| 5,994,167 A * | 11/1999 | Tai et al. | | 438/109 |
| 6,008,535 A * | 12/1999 | Jean et al. | | 257/701 |
| 6,159,771 A * | 12/2000 | Sheng-Hsiung | | 438/113 |
| 6,190,947 B1 * | 2/2001 | Tai et al. | | 438/133 |
| 2002/0179994 A1* | 12/2002 | Chen et al. | | 257/500 |
| 2003/0122231 A1* | 7/2003 | Ahn et al. | | 257/678 |
| 2004/0075160 A1* | 4/2004 | Eng et al. | | 257/623 |
| 2005/0087848 A1* | 4/2005 | Yoon et al. | | 257/676 |

* cited by examiner

*Primary Examiner* — Benjamin Sandvik
(74) *Attorney, Agent, or Firm* — Rosenberg, Klein & Lee

(57) ABSTRACT

A wafer level vertical diode package structure includes a first semiconductor layer, a second semiconductor layer, an insulative unit, a first conductive structure, and a second conductive structure. The second semiconductor layer is connected with one surface of the first semiconductor layer. The insulative unit is disposed around a lateral side of the first semiconductor layer and a lateral side of the second semiconductor layer. The first conductive structure is formed on a top surface of the first semiconductor layer and on one lateral side of the insulative layer. The second conductive structure is formed on a top surface of the second semiconductor layer and on another opposite lateral side of the insulative layer.

11 Claims, 16 Drawing Sheets

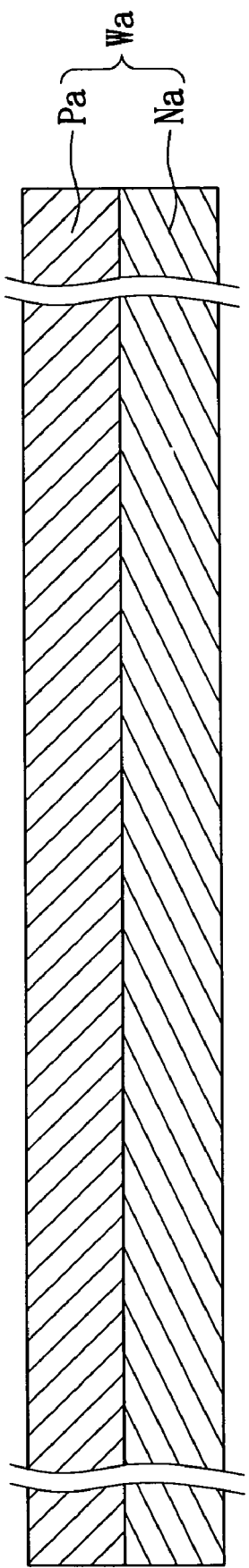
FIG. 2A1
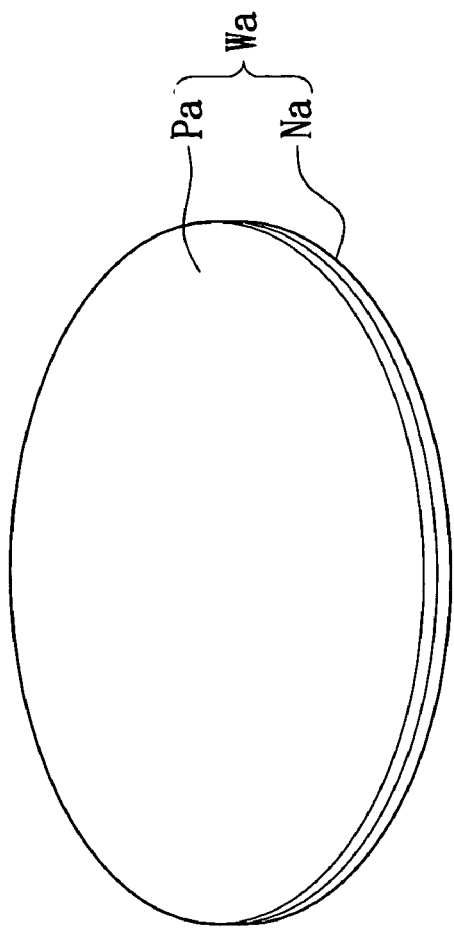
FIG. 2A2

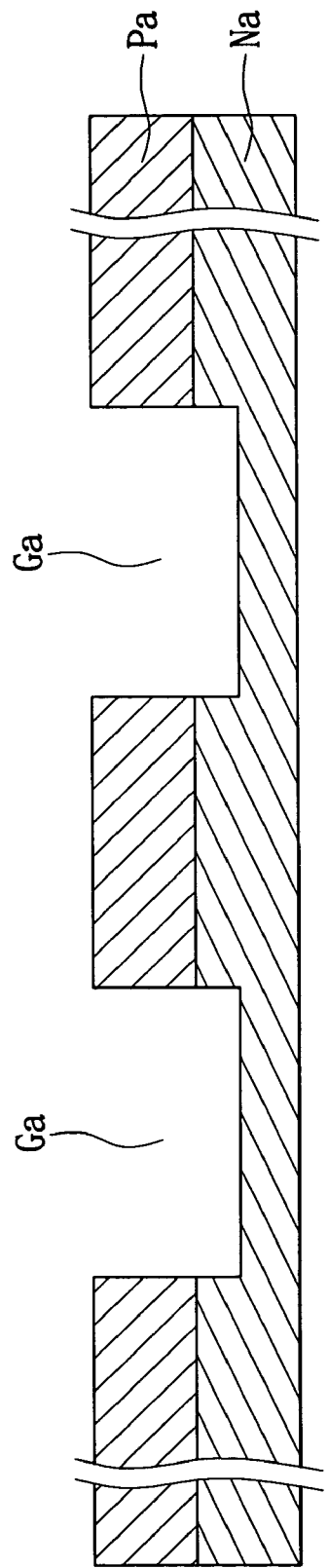
FIG. 2B1
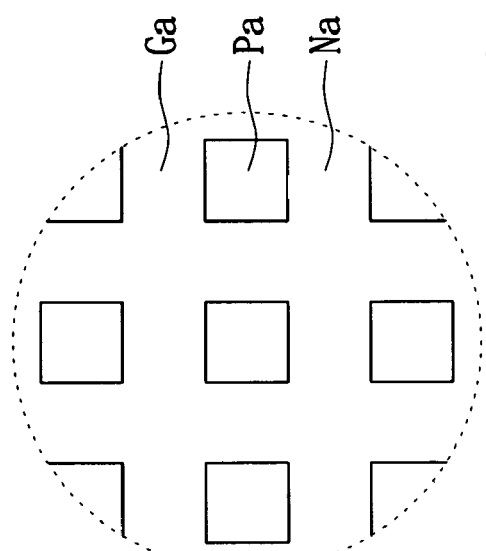
FIG. 2B2

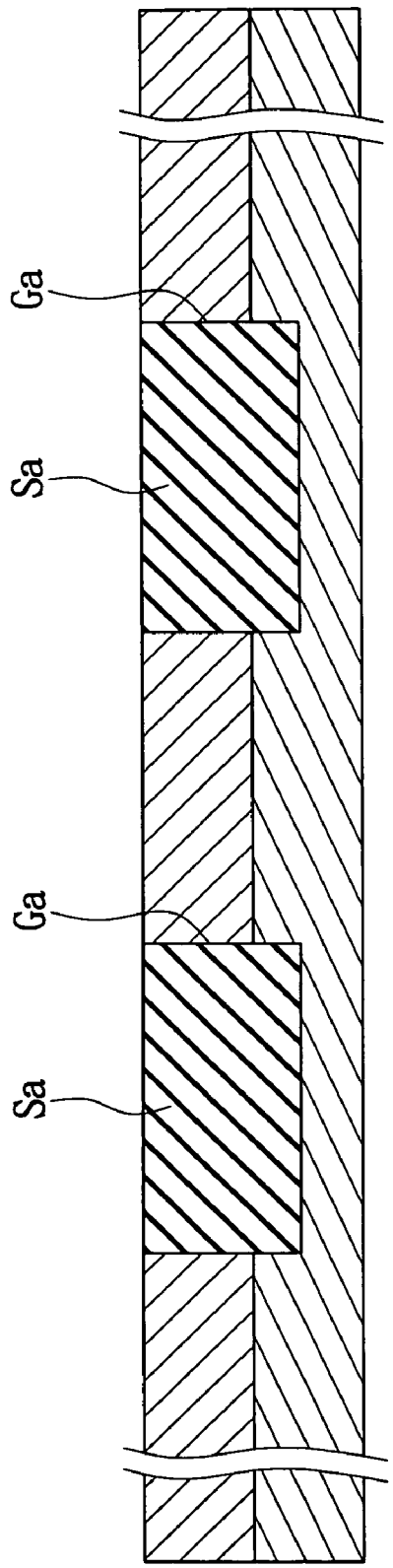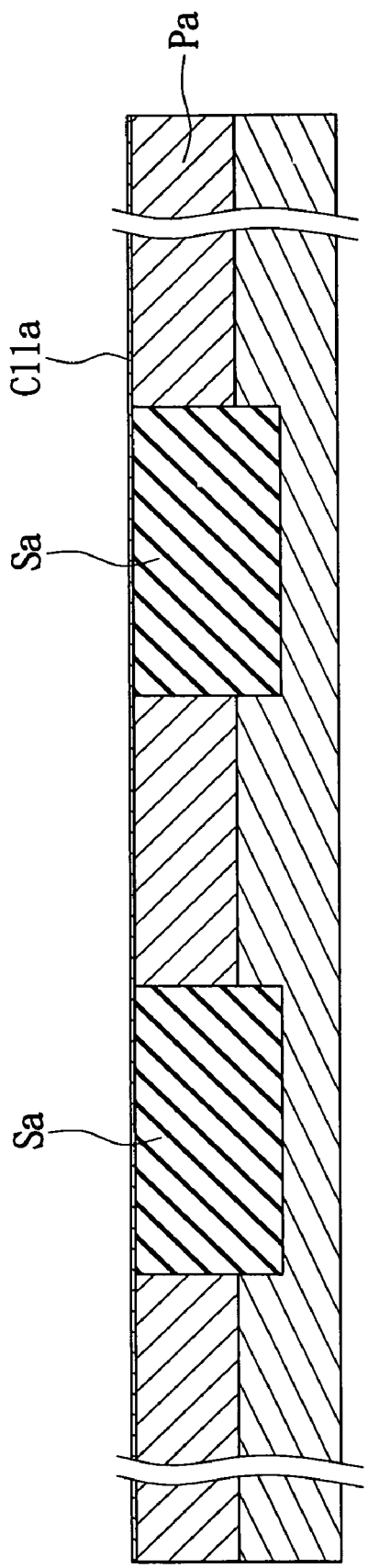

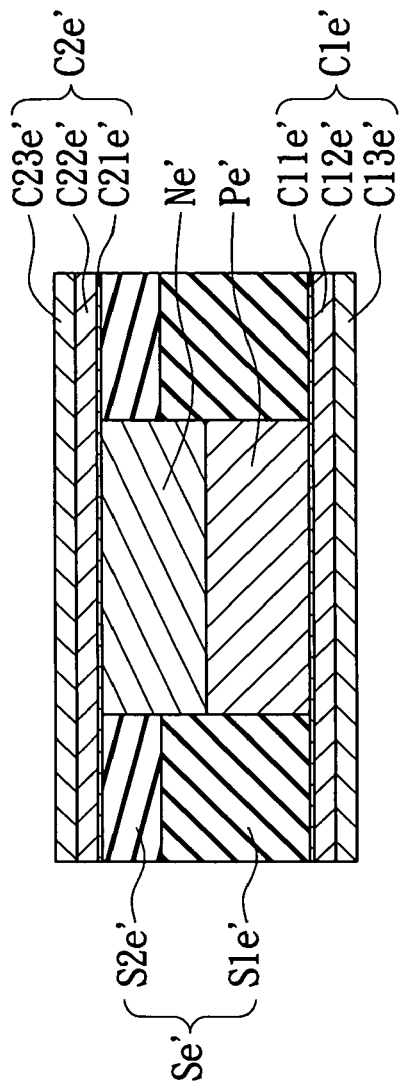
FIG. 4I1
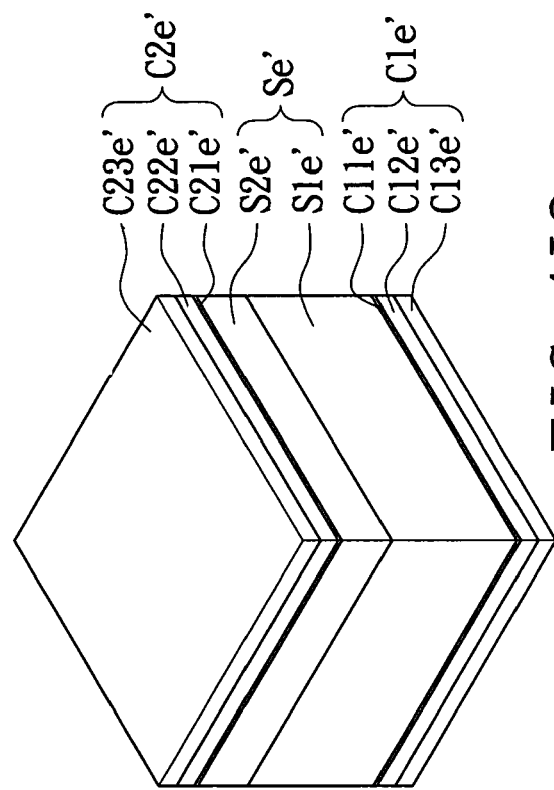
FIG. 4I2

WAFER LEVEL VERTICAL DIODE PACKAGE STRUCTURE AND METHOD FOR MAKING THE SAME

BACKGROUND OF THE INVENTION

1. Field of the Invention

The present invention relates to a diode package structure and a method for making the same, and particularly relates to a wafer level vertical diode package structure and a method for making the same.

2. Description of Related Art

Referring to FIG. 1, the prior art provides a diode package structure that includes a P-type semiconductor layer P, an N-type semiconductor layer N, a metal wire L and a package colloid C. The P-type semiconductor layer P connects with the N-type semiconductor layer N. The N-type semiconductor layer N is electrically disposed on a PCB (Printed Circuit Board) D directly, and the P-type semiconductor layer P is electrically-connected to the PCB D via the metal wire L. In addition, the P-type semiconductor layer P, the N-type semiconductor layer N and the metal wire L are enclosed by the package colloid C. The diode package structure of the prior art can be used as a passive element.

However, the diode package structure has the following drawbacks:

1. The wire-bonding process using metal wire L and the package process using the package colloid C are necessary in the prior art. Hence, the material cost and the manufacturing cost are increased.

2. The P-type semiconductor layer P is electrically connected to the PCB D via the metal wire L, so that the electrical path is long. Hence, the electric conductivity of the prior art is bad.

SUMMARY OF THE INVENTION

One particular aspect of the present invention is to provide a wafer level vertical diode package structure and a method for making the same. The present invention uses at least one insulative layer and at least two conductive structures to package a P-type semiconductor layer and an N-type semiconductor layer that connects to the P-type semiconductor layer. In addition, the two conductive structures is vertically and electrically disposed on a PCB directly, so that the wafer level vertical diode package structure is vertically and electrically disposed on the PCB.

In order to achieve the above-mentioned aspects, the present invention provides a wafer level vertical diode package structure, including: a first semiconductor layer, a second semiconductor layer, an insulative layer, a first conductive structure, and a second conductive structure. The second semiconductor layer is connected with one surface of the first semiconductor layer. The insulative layer is selectively disposed around one part of a lateral side of the first semiconductor layer, around the lateral side of the first semiconductor layer, or around the lateral side of the first semiconductor layer and one part of a lateral side of the second semiconductor layer. The first conductive structure is formed on a top surface of the first semiconductor layer and on a top surface of the insulative layer. The second conductive structure is formed on a top surface of the second semiconductor layer.

In order to achieve the above-mentioned aspects, the present invention provides a wafer level vertical diode package structure, including: a first semiconductor layer, a second semiconductor layer, an insulative unit, a first conductive structure, and a second conductive structure. The second semiconductor layer is connected with one surface of the first semiconductor layer. The insulative unit is disposed around a lateral side of the first semiconductor layer and a lateral side of the second semiconductor layer. The first conductive structure is formed on a top surface of the first semiconductor layer and on one lateral side of the insulative layer. The second conductive structure is formed on a top surface of the second semiconductor layer and on another opposite lateral side of the insulative layer.

In order to achieve the above-mentioned aspects, the present invention provides a method for making a wafer level vertical diode package structure, including: providing a diode wafer that has a first semiconductor unit and a second semiconductor unit connected with a bottom side of the first semiconductor unit; forming a plurality of grooves interlaced with each other and passing through the first semiconductor unit and one part of the second semiconductor unit; forming an insulative unit in the grooves; forming a first conductive unit on a top surface of the first semiconductor unit and on a top surface of the insulative unit; overturning the diode wafer in order to make the second semiconductor unit face up; forming a second conductive unit on a top surface of the second semiconductor unit; and cutting the second conductive unit, the second semiconductor unit, the insulative unit and the first conductive unit in sequence along the grooves in order to form a plurality of second conductive structures, a plurality of insulative layers and a plurality of first conductive structures.

In order to achieve the above-mentioned aspects, the present invention provides a method for making a wafer level vertical diode package structure, including: providing a diode wafer that has a first semiconductor unit and a second semiconductor unit connected with a bottom side of the first semiconductor unit; forming a plurality of first grooves interlaced with each other and passing through the first semiconductor unit and one part of the second semiconductor unit; forming a first insulative unit in the first grooves; forming a first conductive unit on a top surface of the first semiconductor unit and on a top surface of the first insulative unit; overturning the diode wafer in order to make the second semiconductor unit face up; forming a plurality of second grooves passing through one part of the second semiconductor unit in order to expose the first insulative unit; forming a second insulative unit in the second grooves in order to connect the first insulative unit with the second insulative unit, the first semiconductor unit being divided into a plurality of first semiconductor layers and the second semiconductor unit being divided into a plurality of second semiconductor layers respectively connected with the first semiconductor layers; forming a second conductive unit on a top surface of the second semiconductor unit and a top surface of the second insulative unit; and cutting the second conductive unit, the second insulative unit, the first insulative unit and the first conductive unit in sequence along the first grooves or the second grooves in order to form a plurality of second conductive structures, a plurality of second insulative layers, a plurality of first insulative layers and a plurality of first conductive structures.

Therefore, the present invention has the following advantages:

1. The wire-bonding process using metal wire and the package process using the package colloid are unnecessary in the present invention. Hence, the material cost and the manufacturing cost are decreased in the present invention.

2. The wafer level vertical diode package structure is electrically disposed on the PCB via the two conductive structures directly, so that the electrical path is short. Hence, the electric conductivity of the present invention is good.

3. The wafer level vertical diode package structure is cut from a diode wafer directly, so that the wafer level vertical diode package structure does not need to be grinded.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIGS. 2A1 to 2I1 are cross-sectional views of a wafer level vertical diode package structure according to the first embodiment of the present invention, at different stages of the packaging processes, respectively;

FIG. 2I2 is a perspective view of a wafer level vertical diode package structure according to the first embodiment of the present invention;

FIGS. 4A to 4I1 are cross-sectional views of a wafer level vertical diode package structure according to the fifth embodiment of the present invention, at different stages of the packaging processes, respectively;

FIG. 4I2 is a perspective view of a wafer level vertical diode package structure according to the fifth embodiment of the present invention;

DETAILED DESCRIPTION OF PREFERRED EMBODIMENTS

Figure 1:
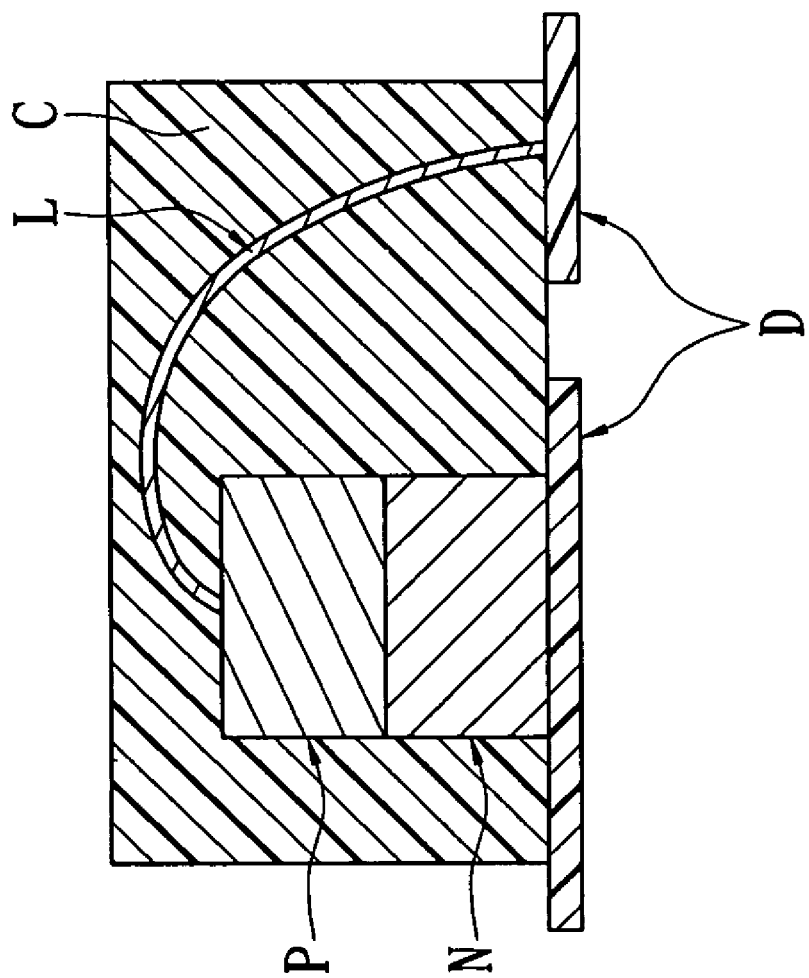
FIG. 1 is a cross-sectional view of a diode package structure of the prior art.
Figure 2:
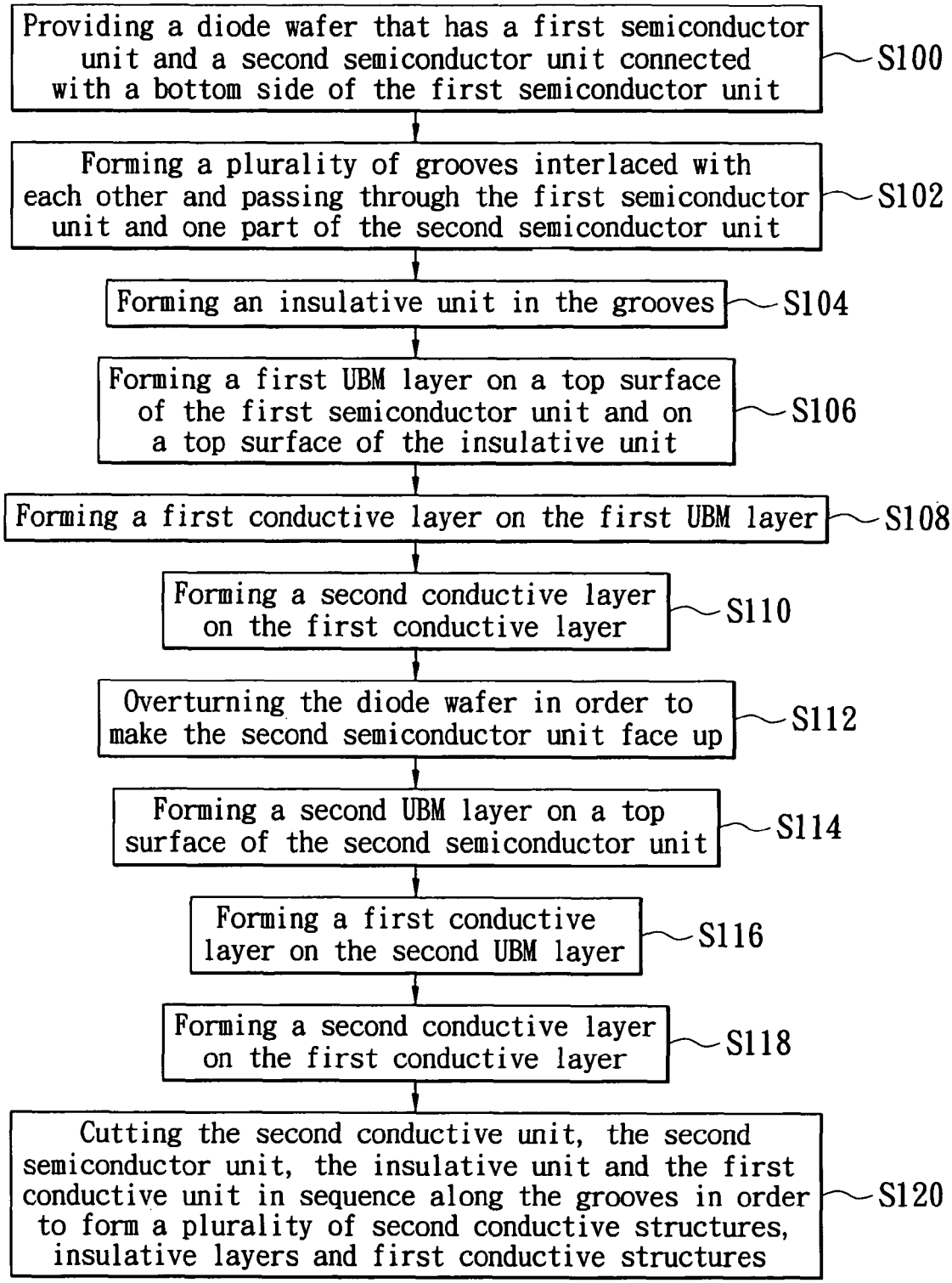
FIG. 2 is a flowchart of a method for making a wafer level vertical diode package structure according to the first embodiment of the present invention.

Referring to FIGS. 2, 2A1-2I1 and 2I2, the first embodiment of the present invention provides a method for making a wafer level vertical diode package structure. The method includes the following steps:

The step S100 is: referring to FIGS. 2, 2A1 and 2A2 (FIG. 2A1 is a partial cross-sectional view of FIG. 2A2), providing a diode wafer Wa that has a first semiconductor unit Pa and a second semiconductor unit Na connected with a bottom side of the first semiconductor unit Pa. In addition, the first semiconductor unit Pa can be a P-type semiconductor layer and the second semiconductor unit Na can be an N-type semiconductor layer; Alternatively, the first semiconductor unit Pa can be an N-type semiconductor layer and the second semiconductor unit Na can be a P-type semiconductor layer, according to different requirements.

The step S102 is: referring to FIGS. 2, 2B1 and 2B2 (FIG. 2B2 is a partial top view of FIG. 2B1), forming a plurality of grooves Ga interlaced with each other and passing through the first semiconductor unit Pa and one part of the second semiconductor unit Na.

The step S104 is: referring to FIGS. 2 and 2C, forming an insulative unit Sa in the grooves Ga. For example, a solder mask layer is formed on the first semiconductor unit Pa and in the grooves Ga firstly, and then a formed solder mask layer is filled in the grooves Ga only by exposing, developing and etching in sequence. The formed solder mask layer is the insulative unit Sa formed in the grooves Ga.

The step S106 is: referring to FIGS. 2 and 2D, forming a first UBM (under bump metallization) layer C11a on a top surface of the first semiconductor unit Pa and on a top surface of the insulative unit Sa. For example, the first UBM layer C11a is formed on the top surface of the first semiconductor unit Pa and on the top surface of the insulative unit Sa by non-electroplating, physical depositing, chemical depositing, sputtering or evaporating.

Figure 2E:
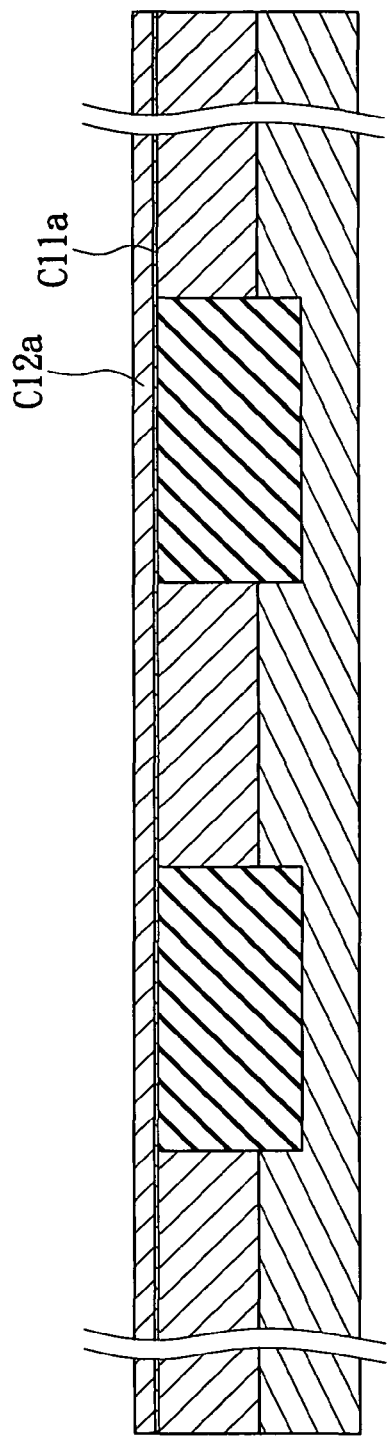

The step S108 is: referring to FIGS. 2 and 2E, forming a first conductive layer C12a on the first UBM layer C11a. For example, the first conductive layer C12a is formed on the first UBM layer C11a by electroplating or non-electroplating.

Figure 2F:
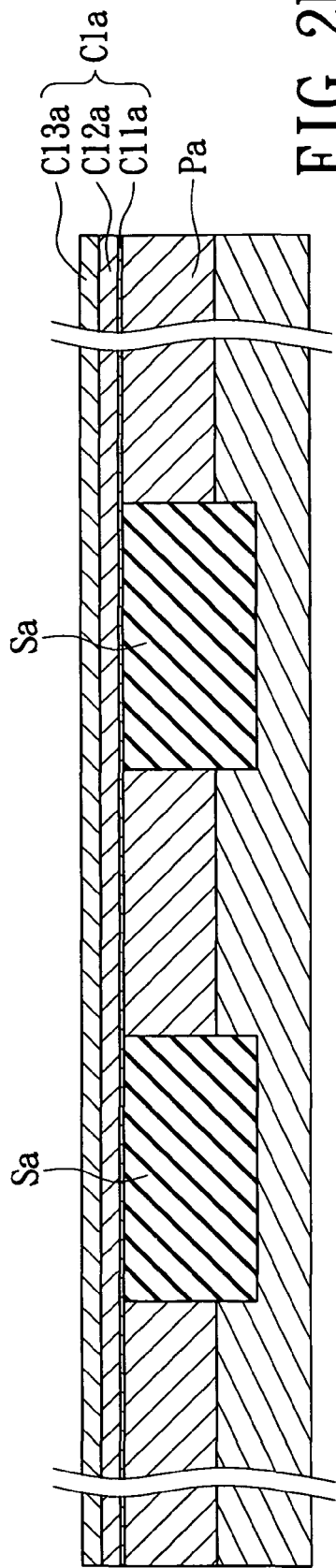

The step S110 is: referring to FIGS. 2 and 2F, forming a second conductive layer C13a on the first conductive layer C12a. For example, the second conductive layer C13a is formed on the first conductive layer C12a by electroplating or non-electroplating.

Hence, the step from S106 to S110 is: forming a first conductive unit C1a on a top surface of the first semiconductor unit Pa and on a top surface of the insulative unit Sa. The first conductive unit C1a has a first UBM layer C11a formed on the top surface of the first semiconductor unit Pa and on the top surface of the insulative unit Sa, a first conductive layer C12a formed on the first UBM layer C11a, and a second conductive layer C13a formed on the first conductive layer C12a.

Figure 2G:
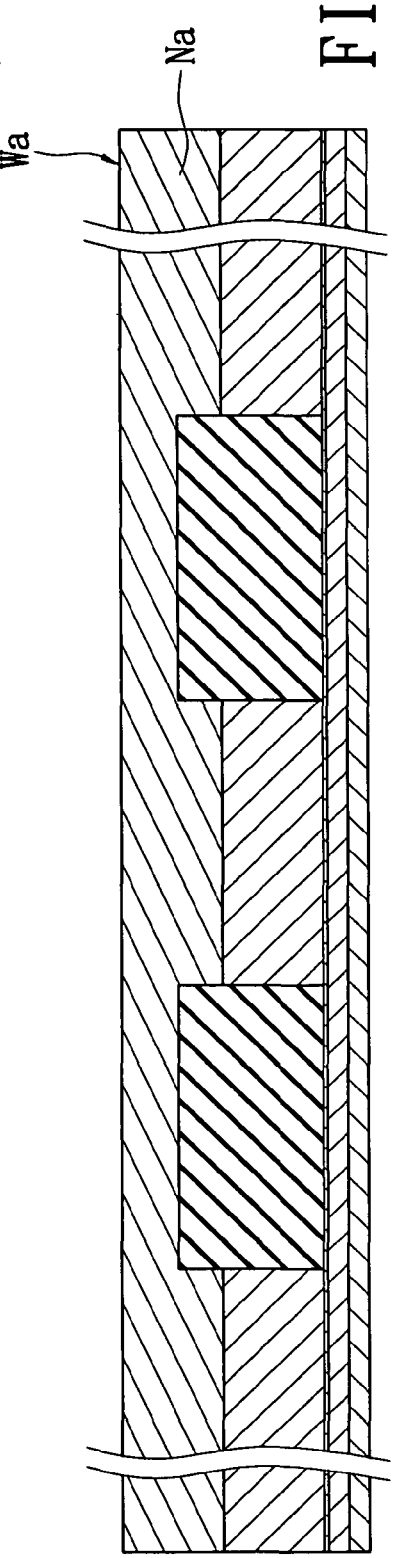

The step S112 is: referring to FIGS. 2 and 2G, overturning the diode wafer Wa in order to make the second semiconductor unit Na face up.

Figure 2H:
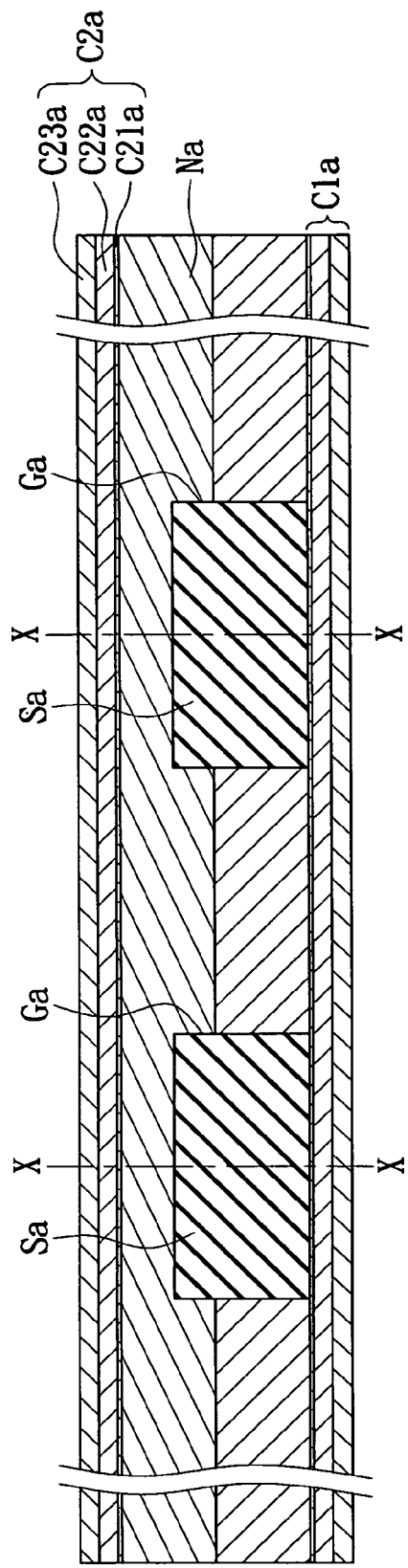
Figure 2H:
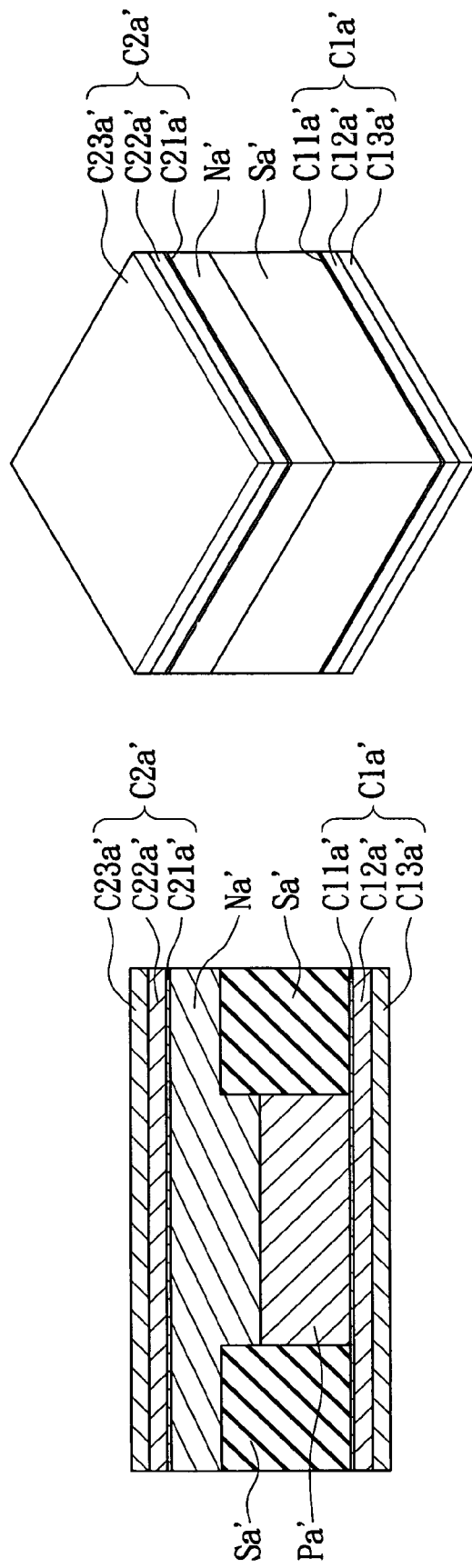
Figure 2H:

The step S114 is: referring to FIGS. 2 and 2H, the same to S106, forming a second UBM layer C21a on a top surface of the second semiconductor unit Na.

The step S116 is: referring to FIGS. 2 and 2H, the same to S108, forming a first conductive layer C22a on the second UBM layer C21a.

The step S118 is: referring to FIGS. 2 and 2H, the same to S110, forming a second conductive layer C23a on the first conductive layer C22a.

In other words, the step from S114 to S118 is: forming a second conductive unit C2a on the top surface of the second semiconductor unit Na. In addition, the second conductive unit C2a has a second UBM layer C21a formed on the top surface of the second semiconductor unit Na, a first conductive layer C22a formed on the second UBM layer C21a, and a second conductive layer C23a formed on the first conductive layer C22a.

The step S120 is: referring to FIGS. 2, 2H and 2I1-2I2 (FIG. 2I1 is a cross-sectional view of FIG. 2I2), cutting the second conductive unit C2a, the second semiconductor unit Na, the insulative unit Sa and the first conductive unit C1a in sequence along the grooves Ga (along X-X lines of FIG. 2H) in order to form a plurality of second conductive structures C2a', a plurality of insulative layers Sa' and a plurality of first conductive structures C1a'.

Hence, referring to FIGS. 2I1 and 2I2, in the step S120, the first semiconductor unit Pa is cut into a plurality of first semiconductor layers Pa', and the second semiconductor unit Na is cut into a plurality of second semiconductor layers Na' respectively connected with the first semiconductor layers Pa'. In addition, each first conductive structure C1a' has a first UBM layer C11a' formed on the top surface of the first semiconductor layer Pa' and on the top surface of the insulative layer Sa', a first conductive layer C12a' formed on the first UBM layer C11a', and a second conductive layer C13a' formed on the first conductive layer C12a'. Each second conductive structure C2a' has a second UBM layer C21a' formed on the top surface of the second semiconductor layer Na', a first conductive layer C22a' formed on the second UBM layer C21a', and a second conductive layer C23a' formed on the first conductive layer C22a'.

Therefore, referring to FIGS. 2I1 and 2I2, the first embodiment of the present invention provides a wafer level vertical diode package structure, including: a first semiconductor layer Pa', a second semiconductor layer Na', an insulative layer Sa', a first conductive structure C1a' and a second conductive structure C2a'.

Moreover, the second semiconductor layer Na' is connected with one surface of the first semiconductor layer Pa'. In addition, the first semiconductor layer Pa' can be a P-type semiconductor layer (such as P-type silicon) and the second semiconductor layer Na' can be an N-type semiconductor layer (such as N-type silicon); Alternatively, the first semiconductor layer Pa' can be an N-type semiconductor layer and the second semiconductor layer Na' can be a P-type semiconductor layer, according to different requirements. Furthermore, the insulative layer Sa' is disposed around a lateral side of the first semiconductor layer Pa' and one part of a lateral side of the second semiconductor layer Na'.

In addition, the first conductive structure C1a' formed on a top surface of the first semiconductor layer Pa' and on a top surface of the insulative layer Sa'. The first conductive structure C1a' has a first UBM layer C11a' formed on the top surface of the first semiconductor layer Pa' and on the top surface of the insulative layer Sa', a first conductive layer C12a' formed on the first UBM layer C11a', and a second conductive layer C13a' formed on the first conductive layer C12a'. Moreover, the second conductive structure C2a' formed on a top surface of the second semiconductor layer Na'. The second conductive structure C2a' has a second UBM layer C21a' formed on the top surface of the second semiconductor layer Na', a first conductive layer C22a' formed on the second UBM layer C21a', and a second conductive layer C23a' formed on the first conductive layer C22a'.

Hence, in each wafer level vertical diode package structure, the first semiconductor layer Pa' is enclosed by the insulative layer Sa', the first conductive layer C1a' and the second semiconductor layer Na'.

Figure 2K:
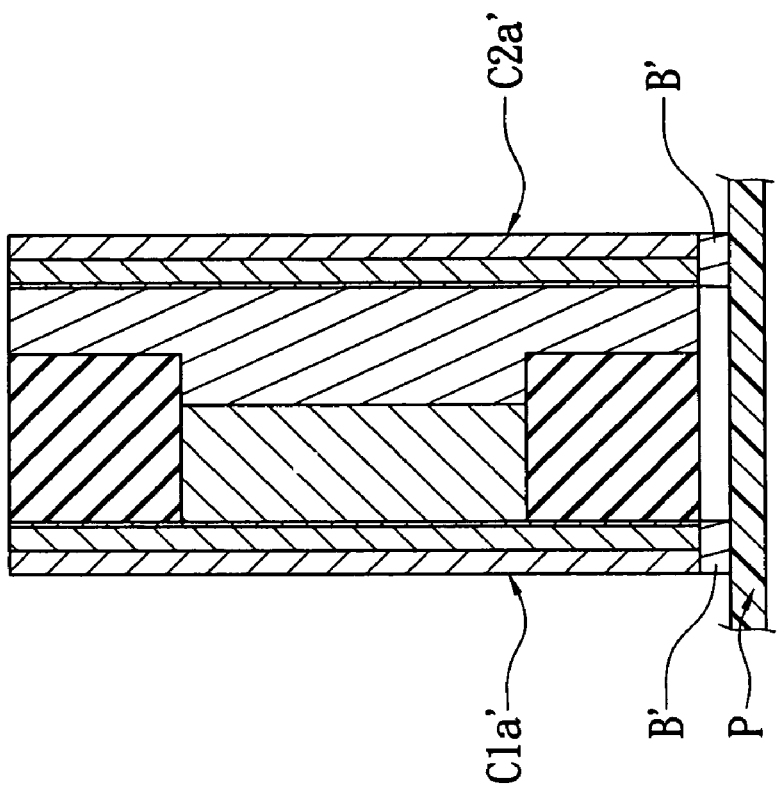
FIG. 2K is a cross-sectional view of a wafer level vertical diode package structure electrically disposed on a PCB via solder glue according to the first embodiment of the present invention.
Figure 2J:
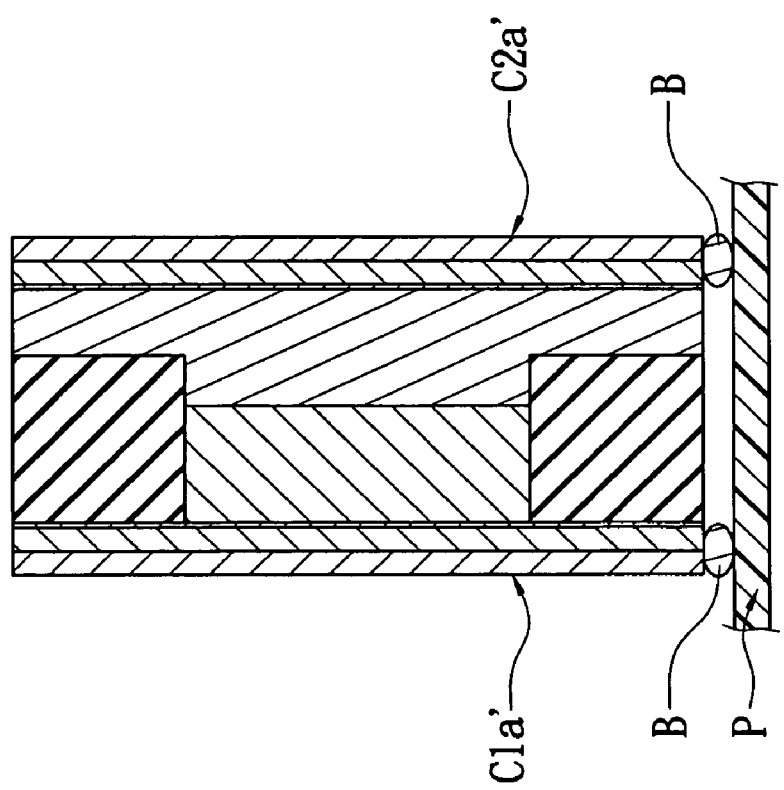
FIG. 2J is a cross-sectional view of a wafer level vertical diode package structure electrically disposed on a PCB via solder balls according to the first embodiment of the present invention.

Referring to FIG. 2J, the first conductive structure C1a' and the second conductive structure C2a' are vertically and electrically disposed on a PCB (Printed Circuit Board) P by at least two solder balls B. In other words, the first conductive structure C1a' and the second conductive structure C2a' are vertically and electrically disposed on the PCB P, so that the wafer level vertical diode package structure is vertically and electrically disposed on the PCB P.

Referring to FIG. 2K, the first conductive structure C1a' and the second conductive structure C2a' are vertically and electrically disposed on a PCB (Printed Circuit Board) P by at least two layers of solder glue B'. In other words, the first conductive structure C1a' and the second conductive structure C2a' are vertically and electrically disposed on the PCB P, so that the wafer level vertical diode package structure is vertically and electrically disposed on the PCB P.

Figure 3A:
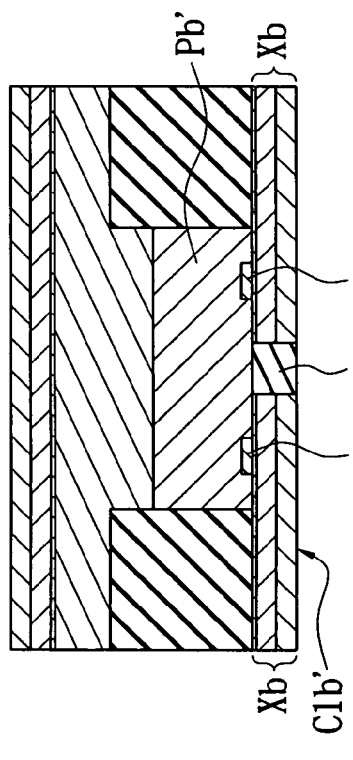
FIG. 3A is a cross-sectional view of a wafer level vertical diode package structure according to the second embodiment of the present invention.

Referring to FIG. 3A, the difference between the second embodiment and the first embodiment (as shown in FIG. 2I1) is that: in the second embodiment, a first semiconductor layer Pb' has at least two conductive pads Ab insulated from each other, and a first conductive structure C1b' has two conductive structures Xb respectively and electrically connected to the two conductive pads Ab and an insulative structure Yb disposed between the two conductive structures Xb. Hence, the second embodiment of the present invention can be applied to a passive element with many contact points.

Figure 3B:
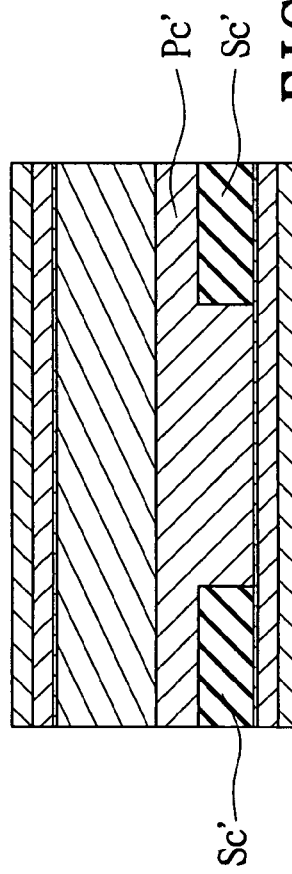
FIG. 3B is a cross-sectional view of a wafer level vertical diode package structure according to the third embodiment of the present invention.

Referring to FIG. 3B, the difference between the third embodiment and the first embodiment (as shown in FIG. 2I1) is that: in the third embodiment, an insulative layer Sc' is disposed around one part of a lateral side of a first semiconductor layer Pc'.

Figure 3C:
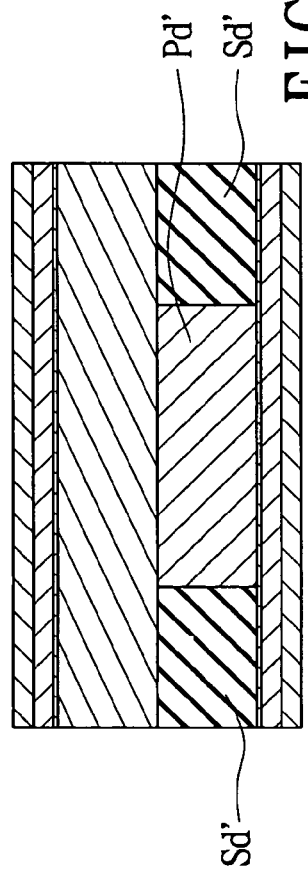
FIG. 3C is a cross-sectional view of a wafer level vertical diode package structure according to the fourth embodiment of the present invention.

Referring to FIG. 3C, the difference between the fourth embodiment and the first embodiment (as shown in FIG. 2I1) is that: in the fourth embodiment, an insulative layer Sd' is disposed around a lateral side of the first semiconductor layer Pd'.

In other words, in the first, the third and the fourth embodiments, the insulative layer (Sa', Sc', Sd') is selectively disposed around the lateral side of the first semiconductor layer Pa' and one part of the lateral side of the second semiconductor layer Na' (such as the first embodiment), around one part of the lateral side of the first semiconductor layer Pc' (such as the third embodiment), or around the lateral side of the first semiconductor layer Pd' (such as the fourth embodiment).

Figure 4:
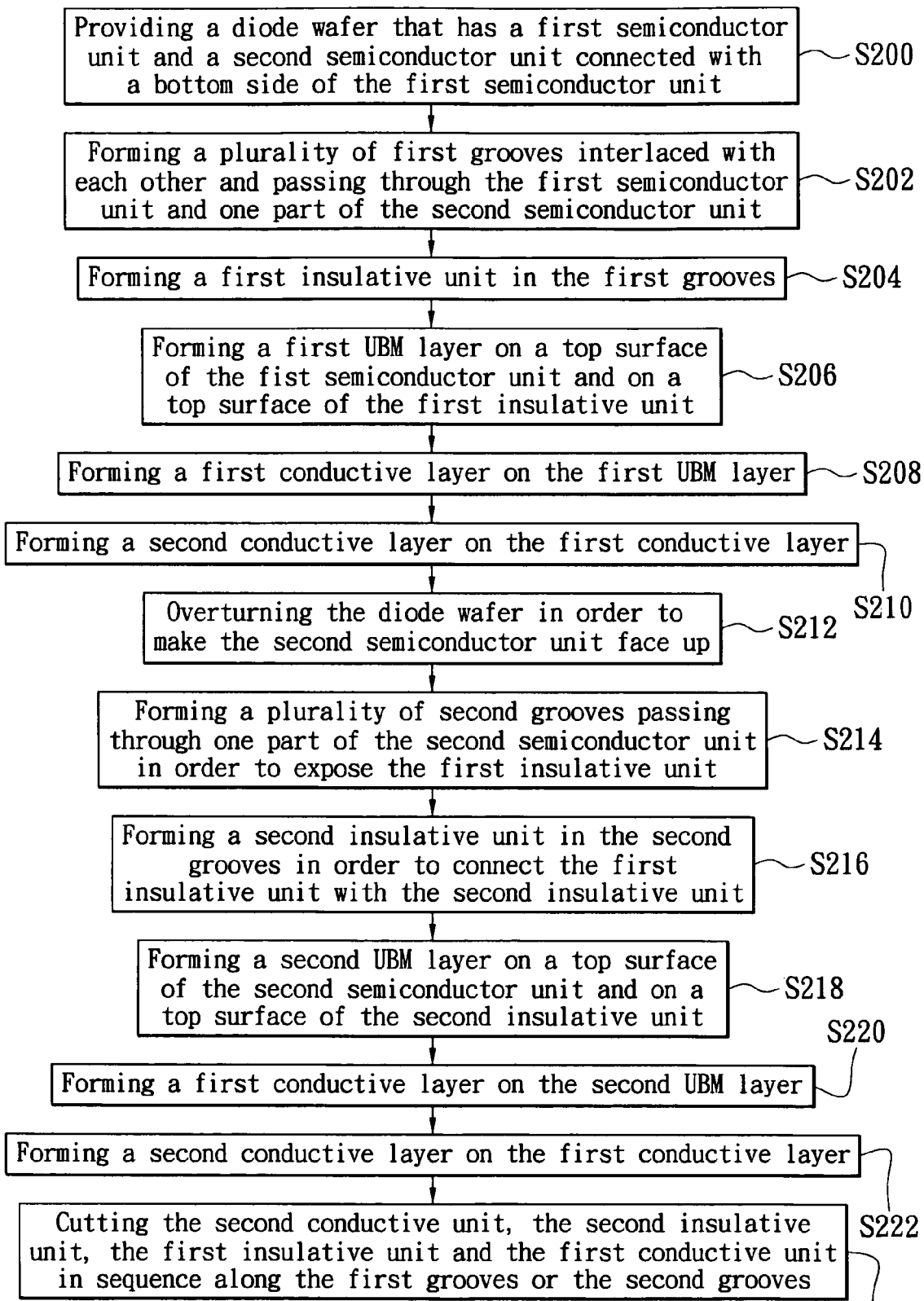
FIG. 4 is a flowchart of a method for making a wafer level vertical diode package structure according to the fifth embodiment of the present invention.
Figure 4A:
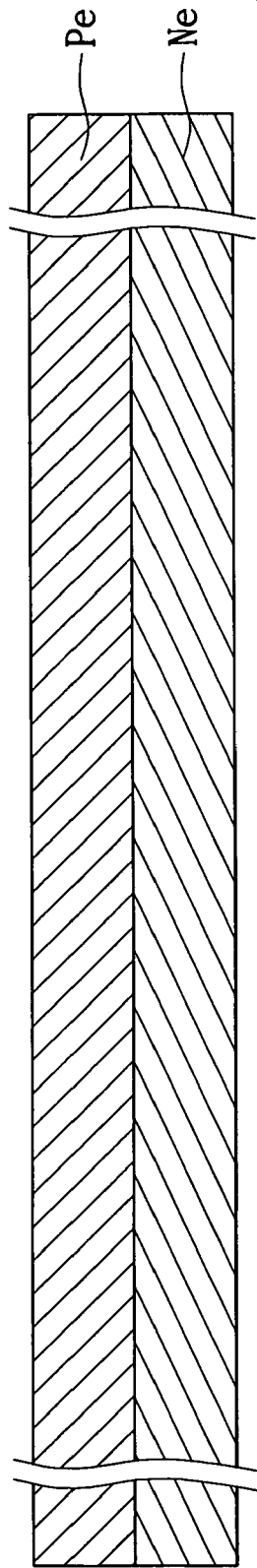

Referring to FIGS. 4, 4A-4I1 and 4I2, the fifth embodiment of the present invention provides a method for making a wafer level vertical diode package structure. The method includes the following steps:

The step S200 is: referring to FIGS. 4 and 4A, providing a diode wafer We that has a first semiconductor unit Pe and a second semiconductor unit Ne connected with a bottom side of the first semiconductor unit Pe. In addition, the first semiconductor unit Pe can be a P-type semiconductor layer and the second semiconductor unit Ne can be an N-type semiconductor layer; Alternatively, the first semiconductor unit Pe can be an N-type semiconductor layer and the second semiconductor unit Ne can be a P-type semiconductor layer, according to different requirements.

Figure 4B:
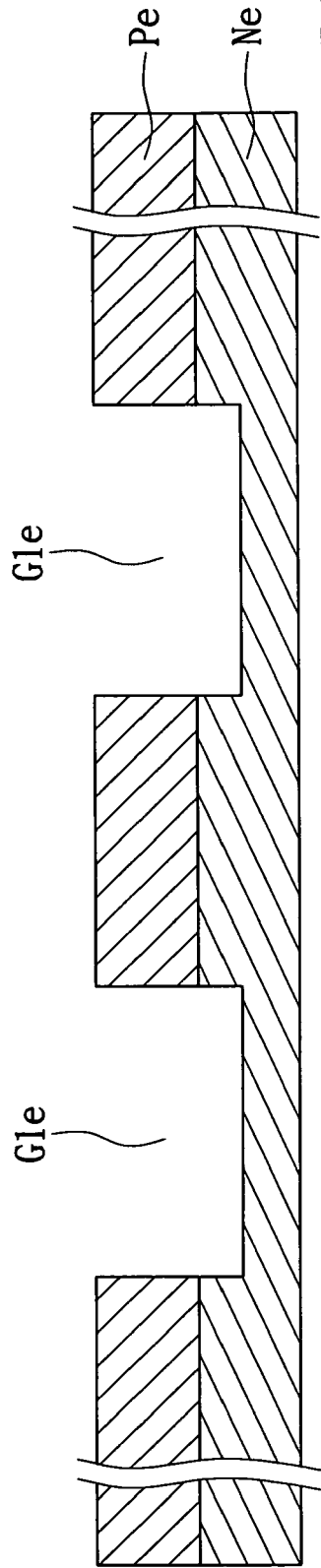

The step S202 is: referring to FIGS. 4 and 4B, forming a plurality of first grooves G1e interlaced with each other and passing through the first semiconductor unit Pe and one part of the second semiconductor unit Ne.

Figure 4C:
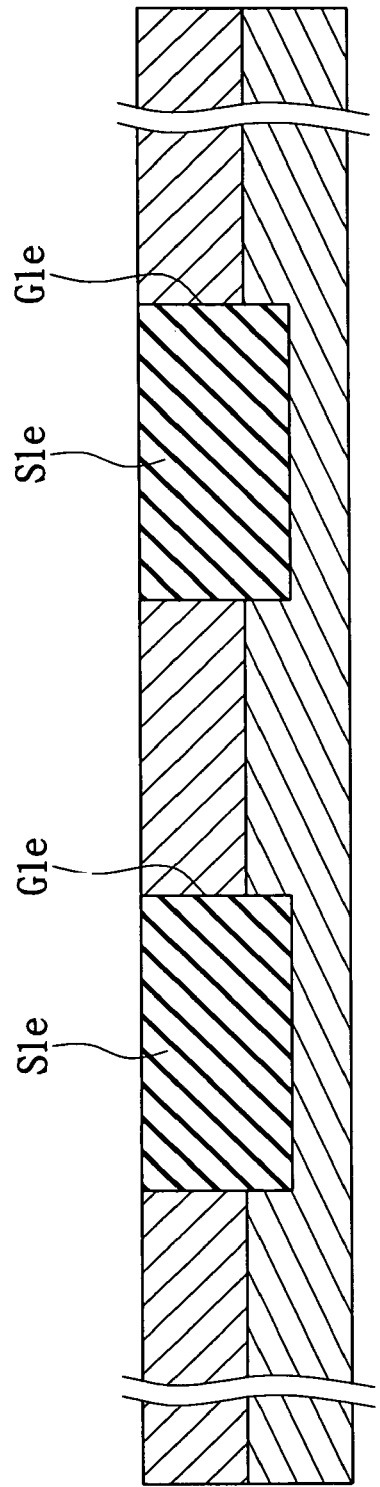

The step S204 is: referring to FIGS. 4 and 4C, forming a first insulative unit S1e in the first grooves G1e. For example, a solder mask layer is formed on the first semiconductor unit Pe and in the first grooves G1e firstly, and then a formed solder mask layer is filled in the first grooves G1e only by exposing, developing and etching in sequence. The formed solder mask layer is the first insulative unit S1e formed in the first grooves G1e.

Figure 4D:
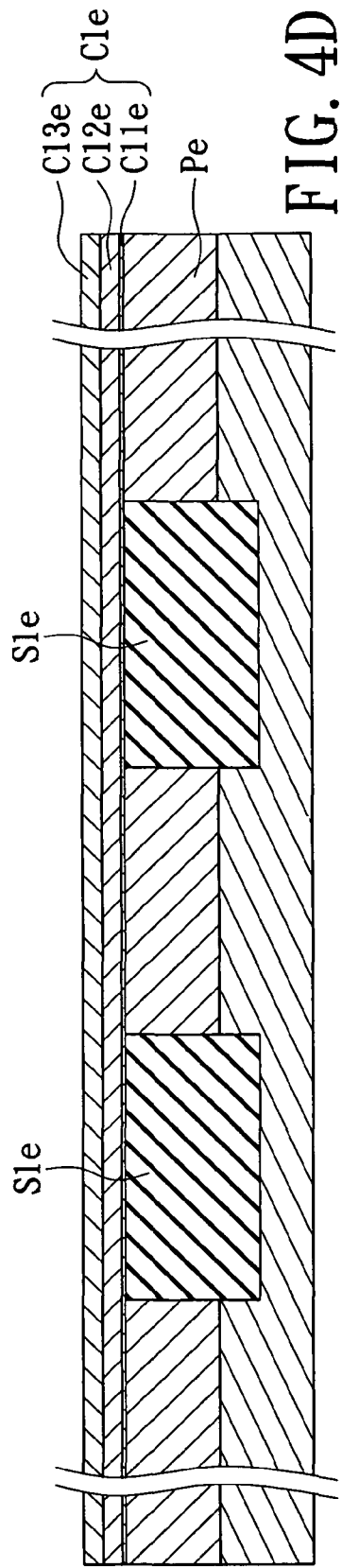

The step S206 is: referring to FIGS. 4 and 4D, forming a first UBM (under bump metallization) layer C11e on a top surface of the first semiconductor unit Pe and on a top surface of the first insulative unit S1e. For example, the first UBM layer C11e is formed on the top surface of the first semiconductor unit Pe and on the top surface of the first insulative unit S1e by non-electroplating, physical depositing, chemical depositing, sputtering or evaporating.

The step S208 is: referring to FIGS. 4 and 4D, forming a first conductive layer C12e on the first UBM layer C11e. For example, the first conductive layer C12e is formed on the first UBM layer C11e by electroplating or non-electroplating.

The step S210 is: referring to FIGS. 4 and 4D, forming a second conductive layer C13e on the first conductive layer C12e. For example, the second conductive layer C13e is formed on the first conductive layer C12e by electroplating or non-electroplating.

Hence, the step from S206 to S210 is: forming a first conductive unit C1e on a top surface of the first semiconductor unit Pe and on a top surface of the first insulative unit S1e. The first conductive unit C1e has a first UBM layer C11e formed on the top surface of the first semiconductor unit Pe and on the top surface of the first insulative unit S1e, a first conductive layer C12e formed on the first UBM layer C11e, and a second conductive layer C13e formed on the first conductive layer C12e.

Figure 4E:
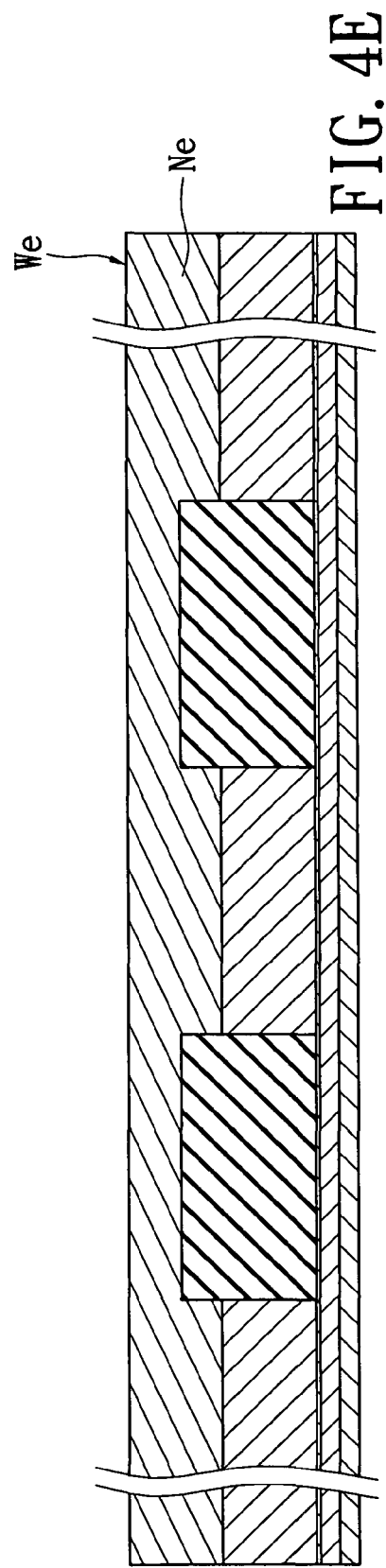

The step S212 is: referring to FIGS. 4 and 4E, overturning the diode wafer We in order to make the second semiconductor unit Ne face up.

Figure 4F:
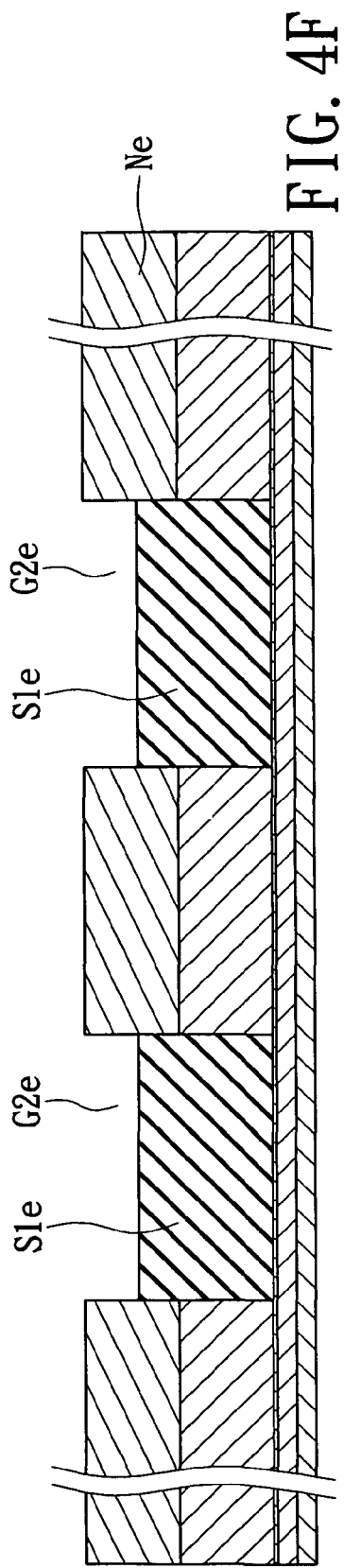

The step S214 is: referring to FIGS. 4 and 4F, forming a plurality of second grooves G2e passing through one part of the second semiconductor unit Ne in order to expose the first insulative unit S1e. For example, the method for forming the second grooves G2e is the same as the method for forming the first grooves G1e in the step S202.

Figure 4G:
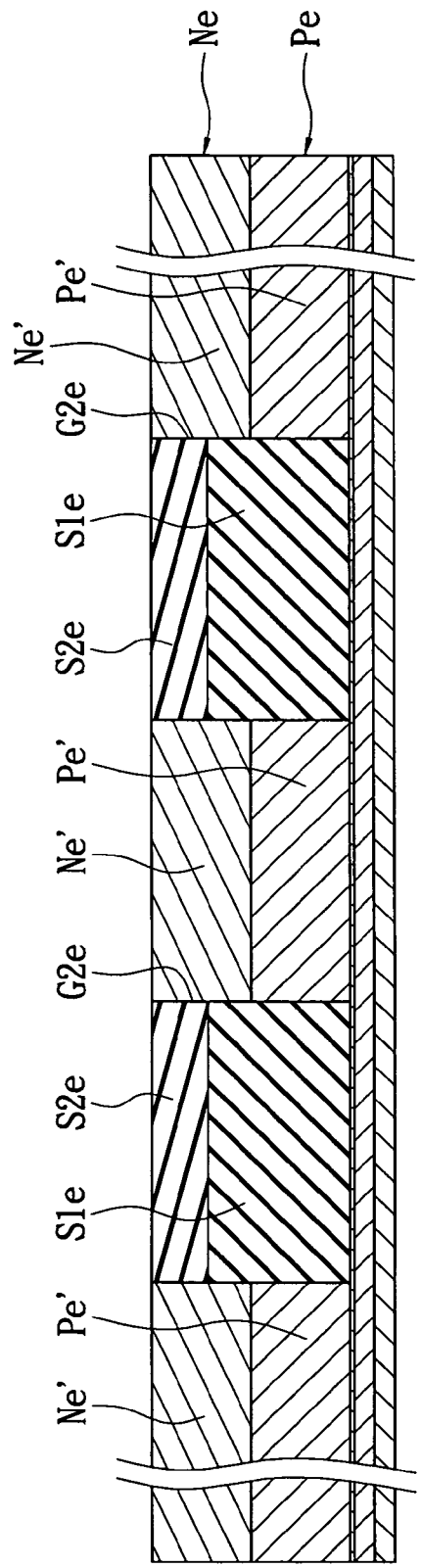

The step S216 is: referring to FIGS. 4 and 4G, forming a second insulative unit S2e in the second grooves G2e in order to connect the first insulative unit S1e with the second insulative unit S2e, the first semiconductor unit Pe being divided into a plurality of first semiconductor layers Pe' and the second semiconductor unit Ne being divided into a plurality of second semiconductor layers Ne' respectively connected with the first semiconductor layers Pe'. In addition, each first semiconductor layer Pe' and each second semiconductor layer Ne' are combined to form a diode. For example, the method for forming the second insulative unit S2e is the same as the method for forming the first insulative unit S1e in the step S204.

Figure 4H:
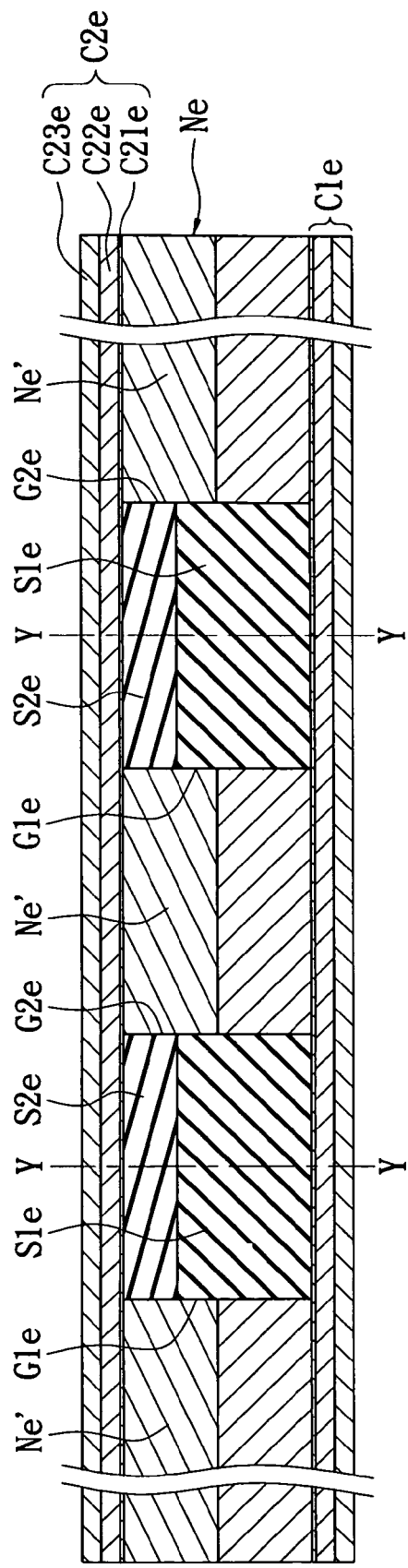

The step S218 is: referring to FIGS. 4 and 4H, forming a second UBM (under bump metallization) layer C21e on a top surface of the second semiconductor unit Ne (or on a top surface of the second semiconductor layer Ne') and on a top surface of the second insulative unit S2e. For example, the second UBM layer C21e is formed on the top surface of the second semiconductor unit Ne (or on the top surface of the second semiconductor layer Ne') and on the top surface of the second insulative unit S2e by non-electroplating, physical depositing, chemical depositing, sputtering or evaporating.

The step S220 is: referring to FIGS. 4 and 4H, forming a first conductive layer C22e on the second UBM layer C21e. For example, the first conductive layer C22e is formed on the second UBM layer C21e by electroplating or non-electroplating.

The step S222 is: referring to FIGS. 4 and 4H, forming a second conductive layer C23e on the first conductive layer C22e. For example, the second conductive layer C23e is formed on the first conductive layer C22e by electroplating or non-electroplating.

Hence, the step from S218 to S222 is: forming a second conductive unit C2e on the top surface of the second semiconductor unit Ne (or on the top surface of the second semiconductor layer Ne') and the top surface of the second insulative unit S2e.

The second conductive unit C2e has a second UBM layer C21e formed on the top surface of the second semiconductor unit Ne (or on the top surface of the second semiconductor layer Ne') and the top surface of the second insulative unit S2e, a first conductive layer C22e formed on the second UBM layer C21e, and a second conductive layer C23e formed on the first conductive layer C22e.

The step S224 is: referring to FIGS. 4, 4H and 4I1-4I2 (FIG. 4I1 is a cross-sectional view of FIG. 4I2), cutting the second conductive unit C2e, the second insulative unit S2e, the first insulative unit S1e and the first conductive unit C1e in sequence along the first grooves G1e or the second grooves G2e (along Y-Y lines of FIG. 4H) in order to form a plurality of second conductive structures C2e', a plurality of second insulative layers S2e', a plurality of first insulative layers S1e' and a plurality of first conductive structures C1e'.

Hence, referring to FIGS. 4I1 and 4I2, each first conductive structure C1e' has a first UBM layer C11e' formed on the top surface of the first semiconductor layer Pe' and on the top surface of the first insulative unit S1e', a first conductive layer C12e' formed on the first UBM layer C11e', and a second conductive layer C13e' formed on the first conductive layer C12e'. Each second conductive structure C2e' has a second UBM layer C21e' formed on the top surface of the second semiconductor layer Ne' and the top surface of the second insulative unit S2e', a first conductive layer C22e' formed on the second UBM layer C21e', and a second conductive layer C23e' formed on the first conductive layer C22e'.

Therefore, referring to FIGS. 4I1 and 4I2, the fifth embodiment of the present invention provides a wafer level vertical diode package structure, including: a first semiconductor layer Pe', a second semiconductor layer Ne', an insulative layer Se', a first conductive structure C1e' and a second conductive structure C2e'.

Moreover, the second semiconductor layer Ne' is connected with one surface of the first semiconductor layer Pe'. In addition, the first semiconductor layer Pe' can be a P-type semiconductor layer (such as P-type silicon) and the second semiconductor layer Ne' can be an N-type semiconductor layer (such as N-type silicon); Alternatively, the first semiconductor layer Pe' can be an N-type semiconductor layer and the second semiconductor layer Ne' can be a P-type semiconductor layer, according to different requirements.

Furthermore, the insulative unit Se' is disposed around a lateral side of the first semiconductor layer Pe' and a lateral side of the second semiconductor layer Ne'. In addition, the insulative unit Se' has a first insulative layer S1e' disposed around a lateral side of the first semiconductor layer Pe' and one part of a lateral side of the second semiconductor layer Ne' and a second insulative layer S2e' disposed around another part of the lateral side of the second semiconductor layer Ne'.

In addition, the first conductive structure C1e' formed on a top surface of the first semiconductor layer Pe' and on a top surface of the first insulative layer S1e'. The first conductive structure C1e' has a first UBM layer C11e' formed on the top surface of the first semiconductor layer Pe' and on the top surface of the first insulative unit S1e', a first conductive layer C12e' formed on the first UBM layer C11e', and a second conductive layer C13e' formed on the first conductive layer C12e'.

Moreover, the second conductive structure C2e' formed on a top surface of the second semiconductor layer Ne' and on a top surface of the second insulative layer S2e'. The second conductive structure C2e' has a second UBM layer C21e' formed on the top surface of the second semiconductor layer Ne' and the top surface of the second insulative unit S2e', a first conductive layer C22e' formed on the second UBM layer C21e', and a second conductive layer C23e' formed on the first conductive layer C22e'.

Hence, in each wafer level vertical diode package structure, the first semiconductor layer Pe' and the second semiconductor Ne' are enclosed by the insulative unit Se' (the first insulative layer S1e' and the second insulative layer S2e'), the first conductive structure C1e' and the second conductive structure C2e'. In other words, the first semiconductor layer Pe' and the second semiconductor layer Ne' are enclosed by each first conductive unit C1e', each second conductive unit C2e', each first insulative layer S1e' and each second insulative layer S2e'.

Figure 4K:
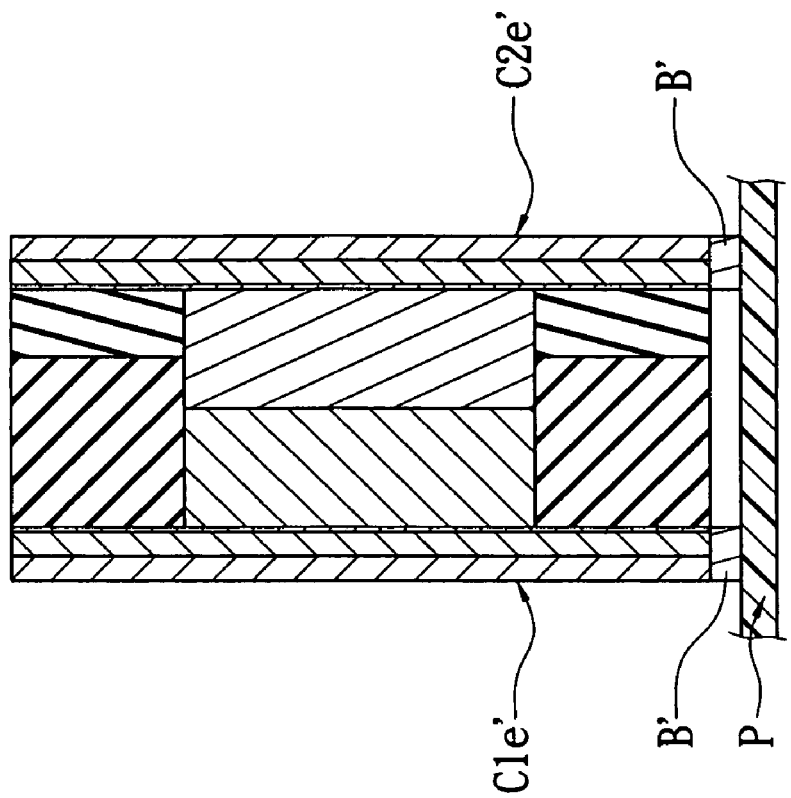
FIG. 4K is a cross-sectional view of a wafer level vertical diode package structure electrically disposed on a PCB via solder glue according to the fifth embodiment of the present invention.
Figure 4J:
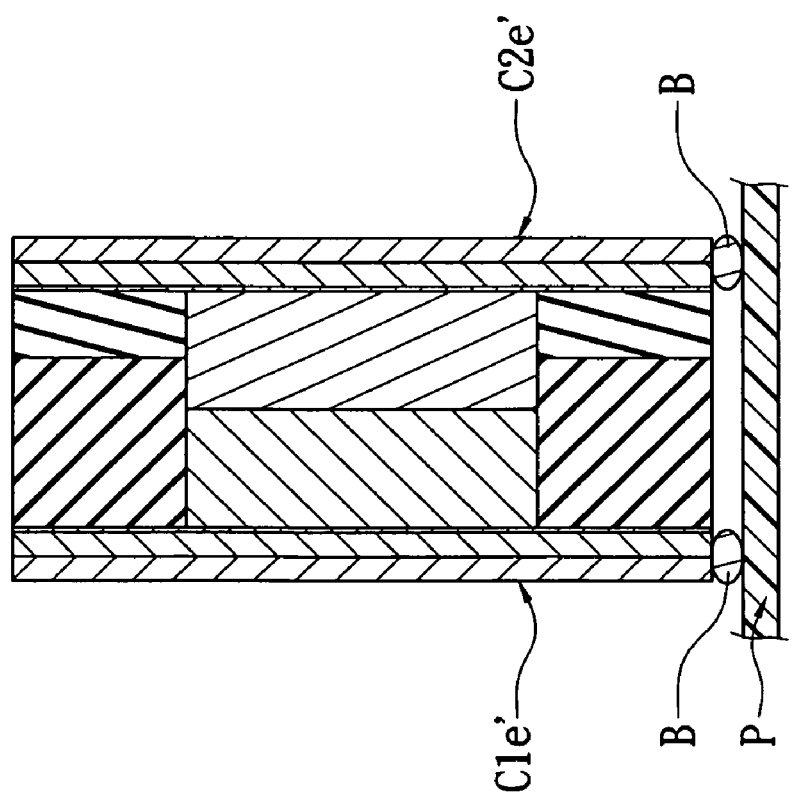
FIG. 4J is a cross-sectional view of a wafer level vertical diode package structure electrically disposed on a PCB via solder balls according to the fifth embodiment of the present invention.

Referring to FIG. 4J, the first conductive structure C1e' and the second conductive structure C2e' are vertically and electrically disposed on a PCB (Printed Circuit Board) P by at least two solder balls B. In other words, the first conductive structure C1e' and the second conductive structure C2e' are vertically and electrically disposed on the PCB P, so that the wafer level vertical diode package structure is vertically and electrically disposed on the PCB P.

Referring to FIG. 4K, the first conductive structure C1e' and the second conductive structure C2e' are vertically and electrically disposed on a PCB (Printed Circuit Board) P by at least two layers of solder glue B'. In other words, the first conductive structure C1e' and the second conductive structure C2e' are vertically and electrically disposed on the PCB P, so that the wafer level vertical diode package structure is vertically and electrically disposed on the PCB P.

Figure 5:
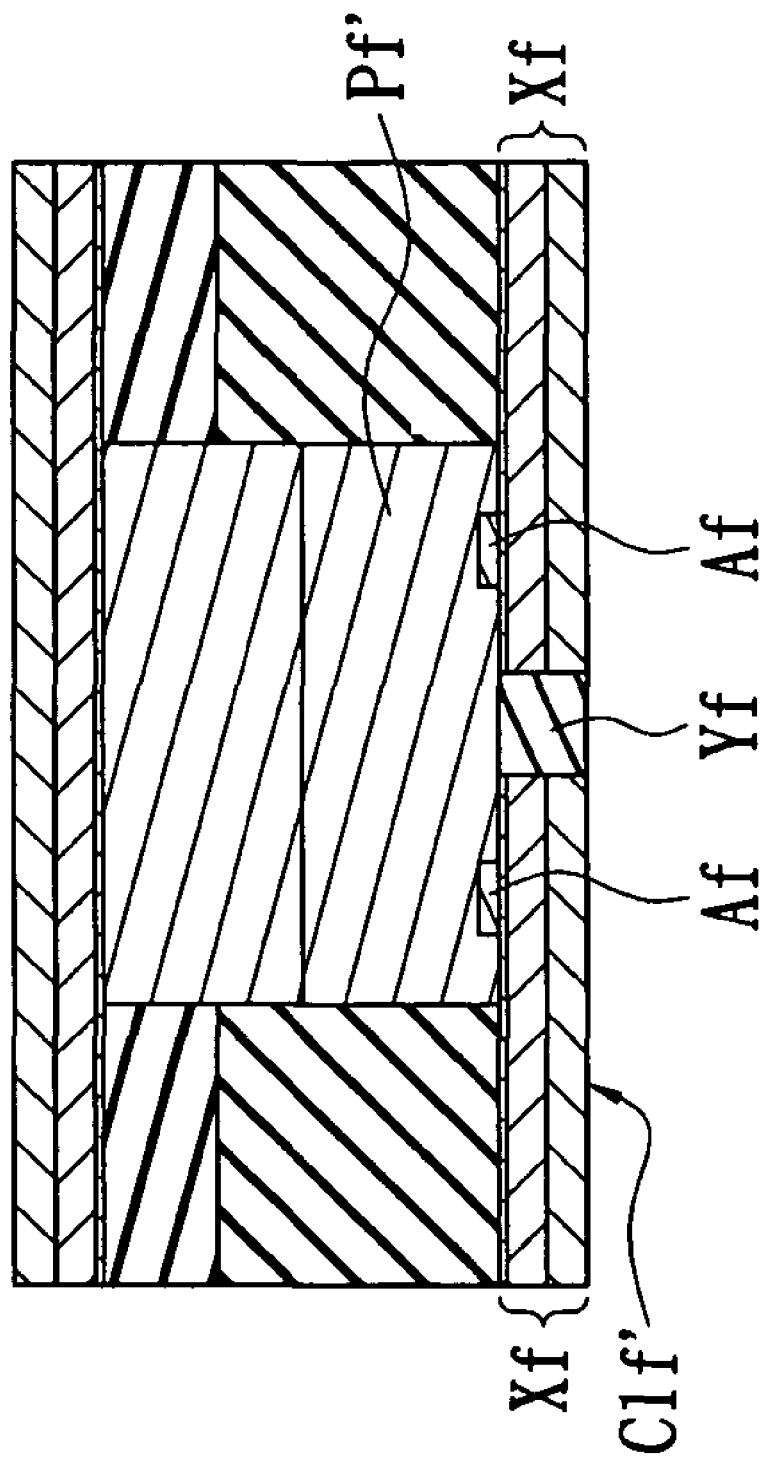
FIG. 5 is a cross-sectional view of a wafer level vertical diode package structure according to the sixth embodiment of the present invention.

Referring to FIG. 5, the difference between the sixth embodiment and the fifth embodiment (as shown in FIG. 4I1) is that: in the sixth embodiment, a first semiconductor layer Pf has at least two conductive pads Af insulated from each other, and a first conductive structure C1f' has two conductive structures Xf respectively and electrically connected to the two conductive pads Af and an insulative structure Yf disposed between the two conductive structures Xf. Hence, the sixth embodiment of the present invention can be applied to a passive element with many contact points.

In conclusion, the present invention uses at least one insulative layer and at least two conductive structures to package a P-type semiconductor layer and an N-type semiconductor layer that connects to the P-type semiconductor layer. In addition, the two conductive structures is vertically and electrically disposed on a PCB directly, so that the wafer level vertical diode package structure is vertically and electrically disposed on the PCB.

Therefore, the present invention has the following advantages:

1. The wire-bonding process using metal wire and the package process using the package colloid are unnecessary in the present invention. Hence, the material cost and the manufacturing cost are decreased in the present invention.

2. The wafer level vertical diode package structure is electrically disposed on the PCB via the two conductive structures directly, so that the electrical path is short. Hence, the electric conductivity of the present invention is good.

3. The wafer level vertical diode package structure is cut from a diode wafer directly, so that the wafer level vertical diode package structure does not need to be grinded.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A wafer level diode package structure, comprising:
 a first semiconductor layer having a peripheral cutting area formed on a peripheral surface thereof;
 a second semiconductor layer connected with the first semiconductor layer, wherein the second semiconductor layer has an inner peripheral cutting area and an outer peripheral cutting area formed on a peripheral surface thereof, the inner peripheral cutting area of the second semiconductor layer is substantially flush with the peripheral cutting area of the first semiconductor layer, and the outer peripheral cutting area of the second semiconductor layer is exposed;
 an insulative layer disposed around and on the peripheral cutting area of the first semiconductor layer and the inner peripheral cutting area of the second semiconductor layer, wherein the insulative layer has a peripheral cutting area formed on a peripheral surface thereof and substantially flush with the outer peripheral cutting area of the second semiconductor layer;
 a first conductive structure formed on a bottom surface of the first semiconductor layer and a bottom surface of the insulative layer, wherein the first conductive structure has a peripheral cutting area formed on a peripheral surface thereof and substantially flush with the peripheral cutting area of the insulative layer; and
 a second conductive structure formed on a top surface of the second semiconductor layer, wherein the second conductive structure has a peripheral cutting area formed on a peripheral surface thereof and substantially flush with the outer peripheral cutting area of the second semiconductor.

2. The wafer level diode package structure as claimed in claim 1, wherein the first semiconductor layer is a P-type semiconductor layer, and the second semiconductor layer is an N-type semiconductor layer.

3. The wafer level diode package structure as claimed in claim 1, wherein the first semiconductor layer is an N-type semiconductor layer, and the second semiconductor layer is a P-type semiconductor layer.

4. The wafer level diode package structure as claimed in claim 1, wherein the second semiconductor layer has a first bottom surface and a second bottom surface separated from and formed around the first bottom surface, the first semiconductor layer has a top surface connected with the first bottom surface of the second semiconductor layer, and the insulative layer has a top surface connected with the second bottom surface of the second semiconductor layer.

5. The wafer level diode package structure as claimed in claim 1, wherein the first conductive structure has a first UBM layer formed on the bottom surface of the first semiconductor layer and the bottom surface of the insulative layer, a first conductive layer formed on the first UBM layer, and a second conductive layer formed on the first conductive layer; wherein the second conductive structure has a second UBM layer formed on the top surface of the second semiconductor layer, a first conductive layer formed on the second UBM layer, and a second conductive layer formed on the first conductive layer.

6. The wafer level diode package structure as claimed in claim 1, wherein the first conductive structure and the second conductive structure are vertically and electrically disposed on a PCB by at least two solder balls or at least two layers of solder glue.

7. The wafer level diode package structure as claimed in claim 1, wherein the first semiconductor layer has at least two conductive pads insulated from each other, and the first conductive structure has two conductive structures respectively and electrically connected to the two conductive pads and an insulative structure disposed between the two conductive structures of the first conductive structure.

8. A wafer level diode package structure, comprising:
a first semiconductor layer having a peripheral cutting area formed on a peripheral surface thereof;
a second semiconductor layer connected with the first semiconductor layer, wherein the second semiconductor layer has a peripheral cutting area exposedly formed on a peripheral surface thereof;
an insulative layer disposed around and on the peripheral cutting area of the first semiconductor layer, wherein the insulative layer has a peripheral cutting area formed on a peripheral surface thereof and substantially flush with the peripheral cutting area of the second semiconductor layer;
a first conductive structure formed on a bottom surface of the first semiconductor layer and a bottom surface of the insulative layer, wherein the first conductive structure has a peripheral cutting area formed on a peripheral surface thereof and substantially flush with the peripheral cutting area of the insulative layer; and
a second conductive structure formed on a top surface of the second semiconductor layer, wherein the second conductive structure has a peripheral cutting area formed on a peripheral surface thereof and substantially flush with the peripheral cutting area of the second semiconductor.

9. The wafer level diode package structure as claimed in claim 8, wherein the second semiconductor layer has a first bottom surface and a second bottom surface flush with the first bottom surface, the first semiconductor layer has a top surface connected with the first bottom surface of the second semiconductor layer, and the insulative layer has a top surface connected with the second bottom surface of the second semiconductor layer.

10. The wafer level diode package structure as claimed in claim 8, wherein the first semiconductor layer has a top surface, a first bottom surface and a second bottom surface separated from and formed around the first bottom surface, the second semiconductor layer has a bottom surface connected with the top surface of the first semiconductor layer, and the insulative layer has a top surface connected with the second bottom surface of the first semiconductor layer.

11. The wafer level diode package structure as claimed in claim 10, wherein the peripheral cutting area of the first semiconductor layer is exposed, and the peripheral cutting area of the first semiconductor layer is flush with the peripheral cutting area of the second semiconductor layer and the peripheral cutting area of the insulative layer.

\* \* \* \* \*